United States Patent [19]
Jackson et al.

[11] Patent Number: 5,836,084
[45] Date of Patent: Nov. 17, 1998

[54] STENCIL DRYER

[75] Inventors: Robert Jackson, Meridian; Wallace E. Croghan, Jr., Boise, both of Id.

[73] Assignee: Hewlett-Packard Company, Palo Alto, Calif.

[21] Appl. No.: 610,316

[22] Filed: Mar. 4, 1996

[51] Int. Cl.$^6$ ........................................... F26B 25/00
[52] U.S. Cl. ............................ 34/107; 34/611; 34/618; 34/629; 34/638; 34/646; 34/653; 34/95; 15/316.1; 15/312.1
[58] Field of Search .................... 34/107, 611, 612, 34/613, 614, 615, 618, 629, 638, 639, 646, 652, 653, 655, 95, 95.1; 134/9, 23, 22.12, 32, 38, 42; 15/316.1, 312.1

[56] References Cited

U.S. PATENT DOCUMENTS

5,560,125 10/1996 Burgi .................................... 34/508

*Primary Examiner*—Henry A. Bennett
*Assistant Examiner*—Pamela A. O'Connor

[57] ABSTRACT

An automated stencil dryer includes a holder mechanism for holding a stencil, a discharge mechanism for discharging air against a stencil positioned in the holder, and a driver mechanism operatively coupled to the discharge mechanism for automatically moving the discharge mechanism so that compressed air can be discharged fully across the surface of the stencil. In one embodiment, the discharge mechanism includes a pair of air knives disposed parallel to one another on opposite sides of the holder so that the stencil is between the air knives when the stencil is positioned in the holder. The air knives are oriented inward toward the stencil when the stencil is positioned in the holder so that air discharged from the air knives is directed against the stencil. In another embodiment, the discharge mechanism includes a pair of air distribution pipes disposed parallel to one another on opposite sides of the holder so that the stencil is between the distribution pipes when the stencil is positioned in the holder. A plurality of orifices are disposed along each distribution pipe through which air is discharged. The orifices are oriented inward toward the stencil when the stencil is positioned in the holder to direct air against the stencil. An optional feature provides a squeegee holder disposed adjacent to the channels. The squeegee holder holds a squeegee within the extent of the stencil so that air discharged from the discharge mechanism is directed against the squeegee when the squeegee is positioned in the squeegee holder.

20 Claims, 10 Drawing Sheets

STENCIL DRYER

FIELD OF THE INVENTION

The invention relates generally to equipment for manufacturing printed circuit boards and, more particularly, to a machine for drying stencils used in the application of solder paste to printed circuit boards.

BACKGROUND OF THE INVENTION

A common technique for manufacturing printed circuit boards includes soldering electronic or electrical components directly onto the surface of the printed circuit boards. This technique is typically referred to as "surface mounting." Surface mounting has substantially replaced the older technique of mounting the components by inserting wire leads through holes in the printed circuit board, bending the leads and then soldering the leads to the conductive paths on the backside of the boards. Where surface mounting is used, the components are soldered onto metal pads formed on the surface of the board. The pads are connected in the desired configuration to the wiring pattern in the printed circuit board. A solder paste is applied to the pads before the components are placed on the board. The solder paste is applied through a stencil. The openings in the stencil correspond to the size and pattern of the pads on the board. The stencil is held in a frame. After the stencil/frame has been aligned with the printed circuit board, the stencil is dropped into contact with the board and a squeegee blade wipes across the stencil to push solder paste through the openings in the stencil onto the pads on the printed circuit board. The stencil is then lifted from the printed circuit board and the board is conveyed to subsequent processing stations where the components are mounted on the board.

Each stencil must be cleaned periodically to remove solder paste residue that accumulates on the stencils. The stencils are cleaned by submersing each stencil/frame assembly in a cleaning solution and, typically, applying ultrasonic vibrations. After cleaning, the stencils must be dried or allowed to dry before they can be used again to apply solder paste. So far as applicants are aware, conventional methods for drying the stencils include manually wiping down both sides of the stencil with an absorbent cloth or blowing compressed air over the stencil with a hand held air gun or nozzle. Manually wiping the stencils is awkward and slow, and frequently causes damage to the stencils. The stencils are very thin, on the order of 7 mils (0.007 inches). Any localized pressure may cause damage. Damaged stencils are costly to replace and result in manufacturing downtime that reduces throughput. Manually blowing compressed air over the stencils has also proved to be an undesirably slow method of drying the stencils that carries the risk of damaging the stencil with the air gun. There remains a need for an automated stencil dryer that reduces the time required to dry each stencil and minimizes the risk of damaging the stencils during the drying operation.

SUMMARY OF THE INVENTION

Accordingly, it is one object of the invention to partially automate the process of drying stencils. It is another object to reduce the time needed to dry the stencils. It is still another object of the invention to minimize the risk of damaging stencils during drying operations.

These and other objects and advantages may be achieved by an automated stencil dryer that includes a holder mechanism for holding a stencil having a planar surface, a discharge mechanism for discharging air against a stencil positioned in the holder, and a driver mechanism operatively coupled to the discharge mechanism for automatically moving the discharge mechanism so that compressed air can be discharged fully across the surface of the stencil. In one preferred version of the invention, the discharge mechanism includes a pair of air knives disposed parallel to one another on opposite sides of the holder so that the stencil is between the air knives when the stencil is positioned in the holder. The air knives are oriented inward toward the stencil so that air discharged from the air knives is directed against the stencil.

In an alternative version of the invention, the discharge mechanism includes a pair of air distribution pipes disposed parallel to one another on opposite sides of the holder so that the stencil is between the distribution pipes when the stencil is positioned in the holder. A plurality of orifices are disposed along each distribution pipe through which air is discharged against the stencil. As with the air knives, the orifices on the distribution pipes are oriented inward toward the stencil so that air discharged from the orifices is directed against the stencil.

The stencil dryer of the present invention, described in more detail below, automatically directs compressed air over a stencil to remove and dry residual cleaning solution. The new stencil dryer reduces the time needed to dry the stencils compared to conventional methods, and minimizes the risk of damaging stencils during drying operations.

DETAILED DESCRIPTION OF THE INVENTION

Figure 1:
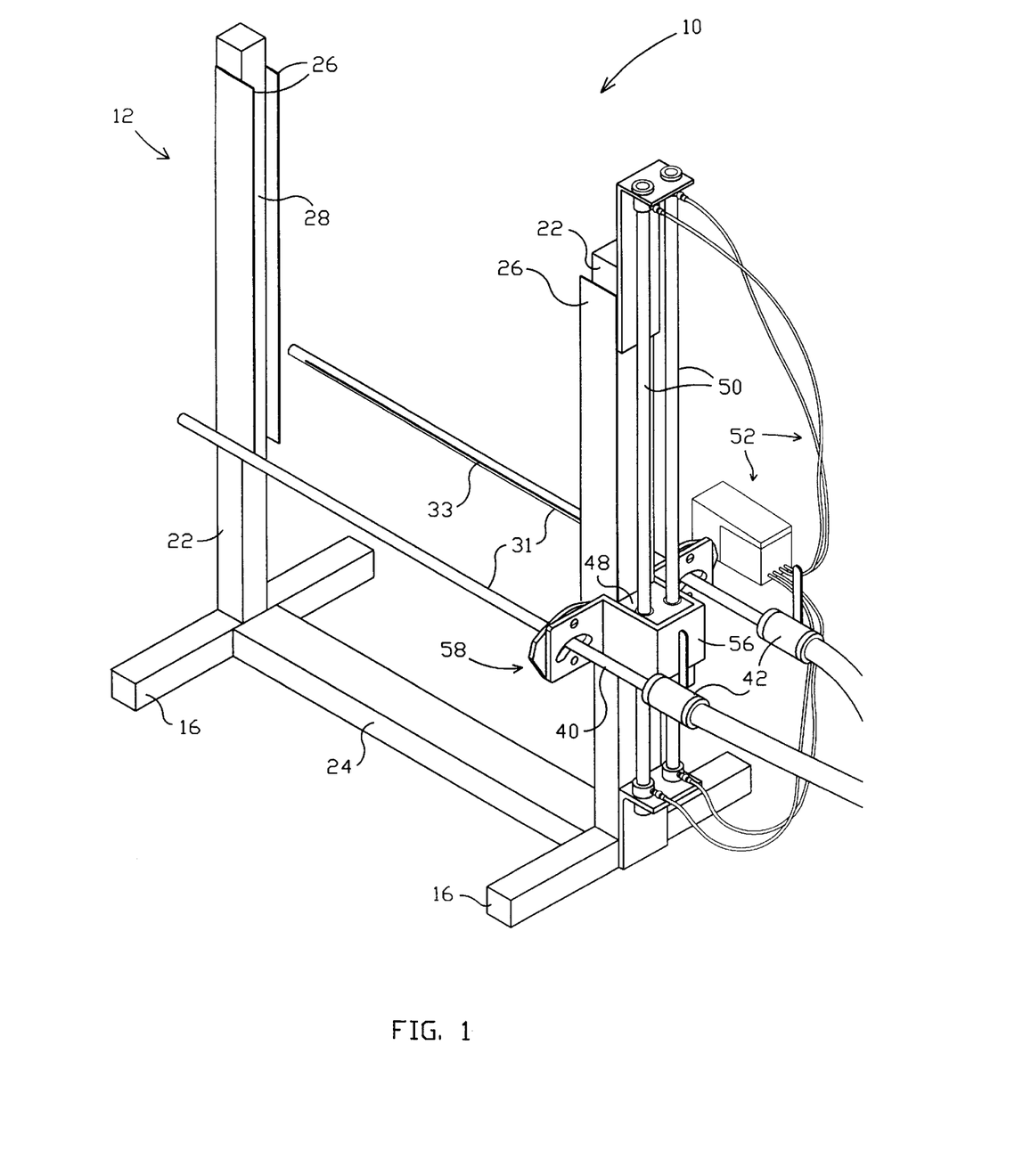
FIG. 1 is a perspective view of one embodiment of the invented stencil dryer wherein compressed air is discharged through a pair of air knives.
Figure 2:
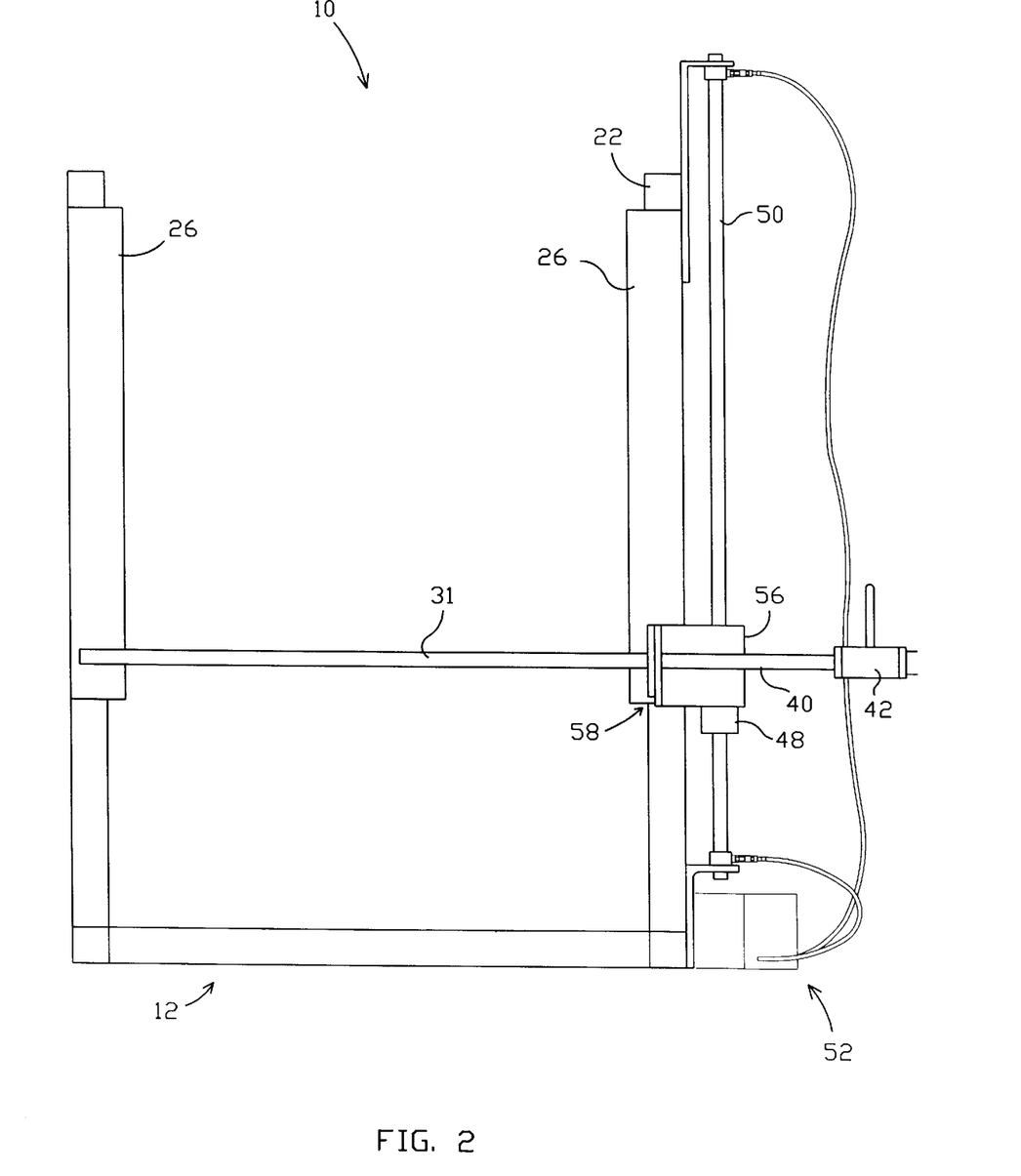
FIG. 2 is a front elevation view of the stencil dryer of FIG. 1.
Figure 3:
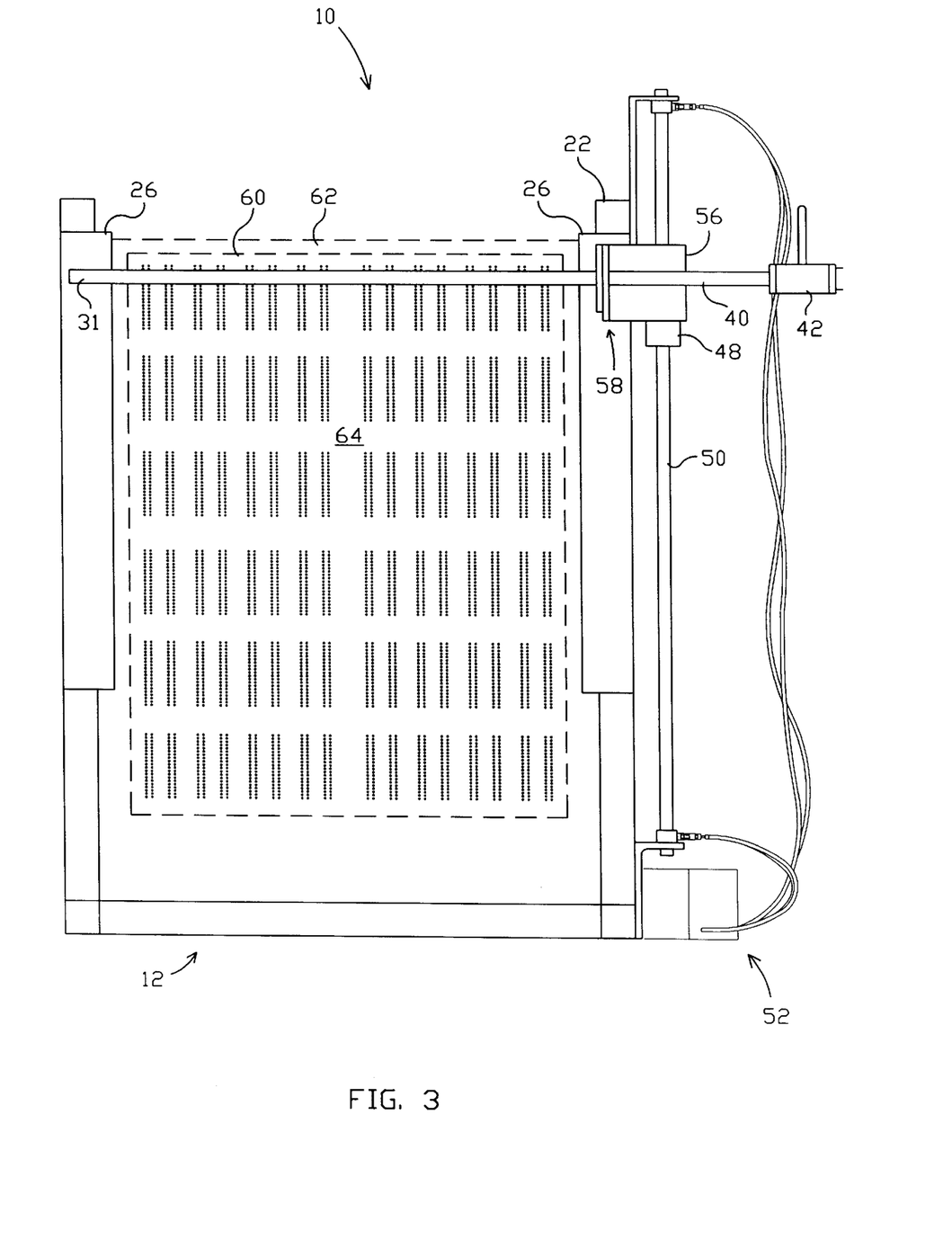
FIG. 3 is a front elevation view of the stencil dryer of FIG. 1 with a stencil positioned in the dryer.
Figure 4:
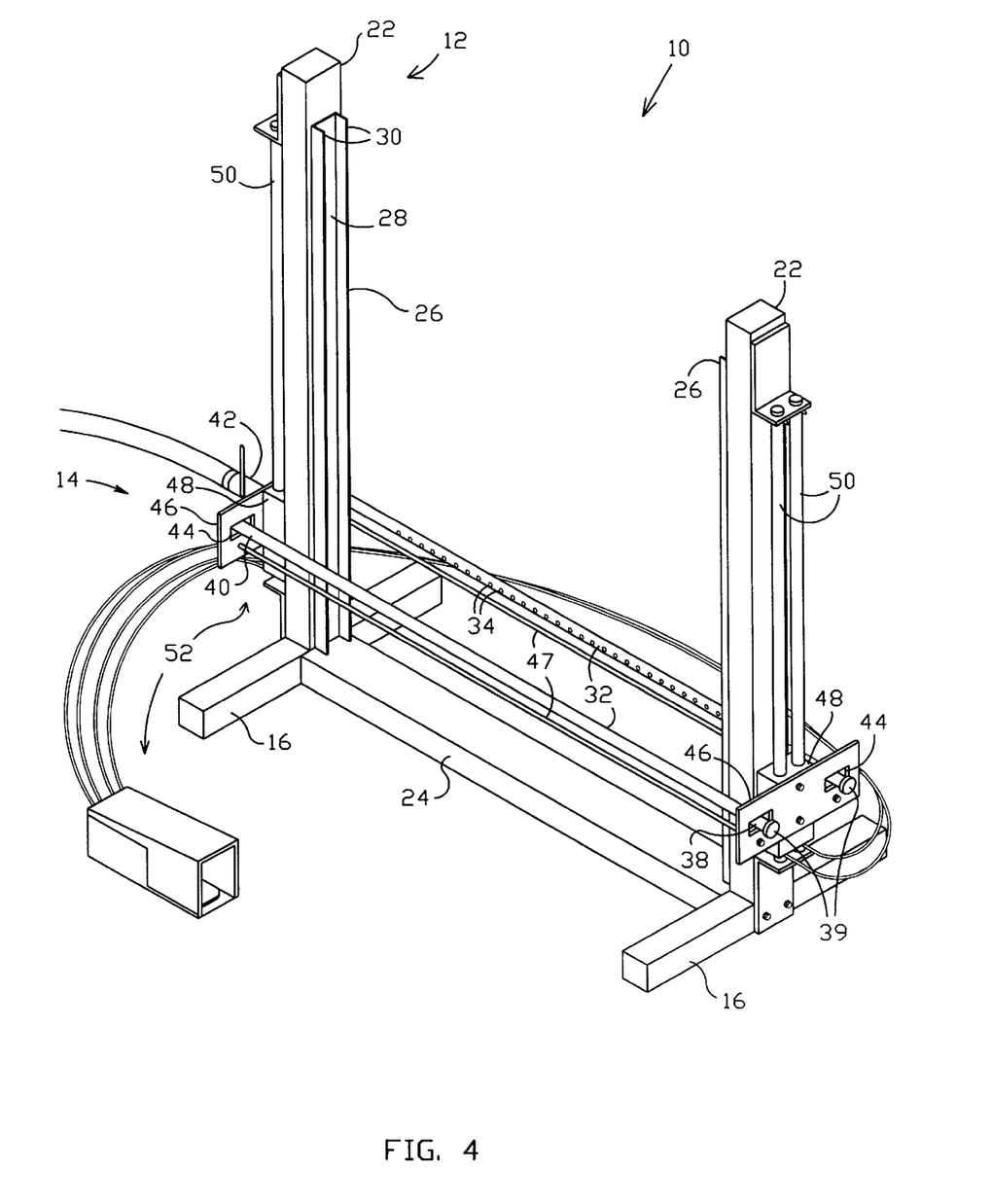
FIG. 4 is a perspective view of an alternative embodiment of the invented stencil dryer wherein compressed air is discharged through orifices in a pair of distribution pipes.
Figure 5:
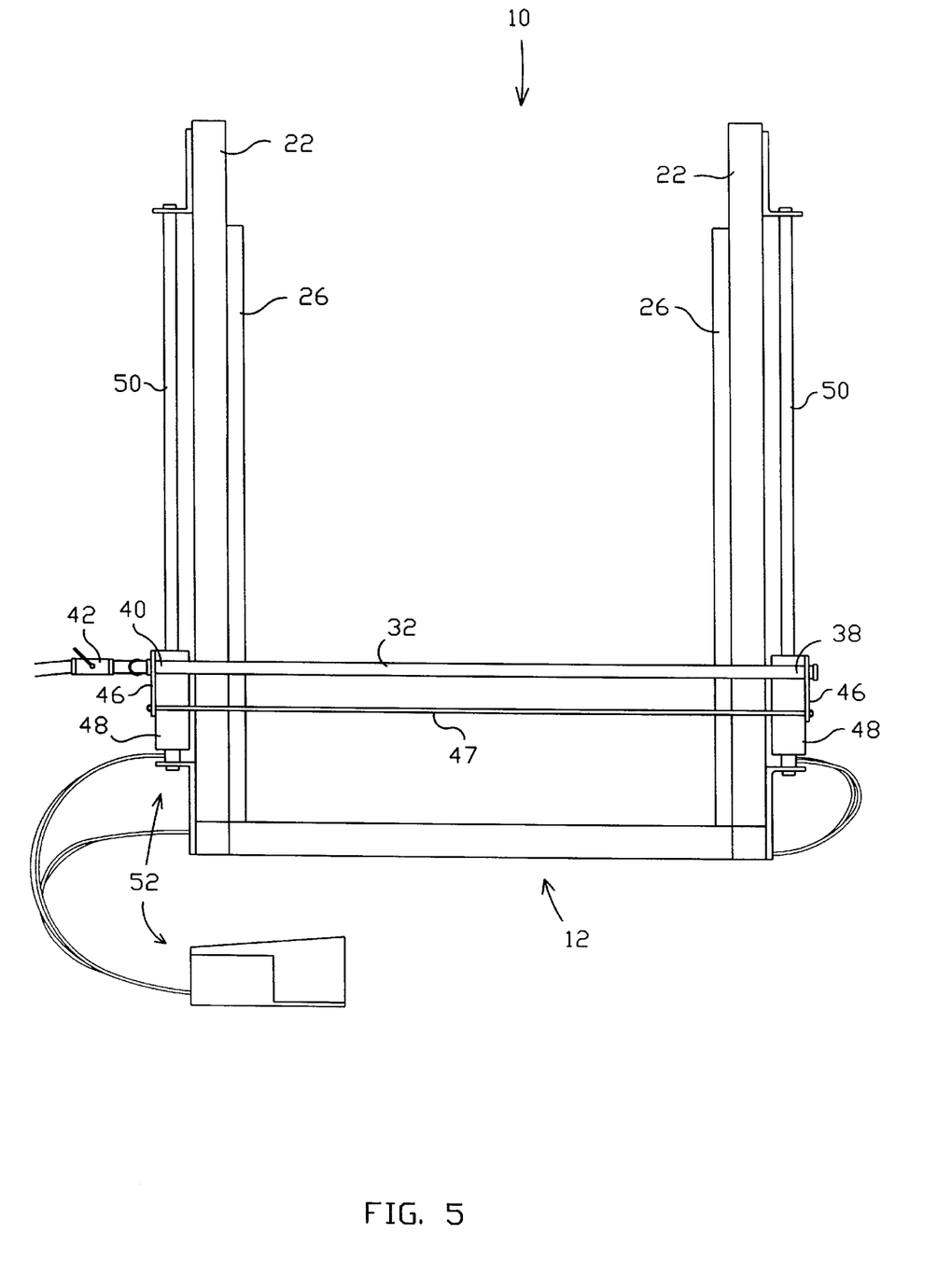
FIG. 5 is a front elevation view of the stencil dryer of FIG. 4 with the distribution pipes in the lowered position.
Figure 6:
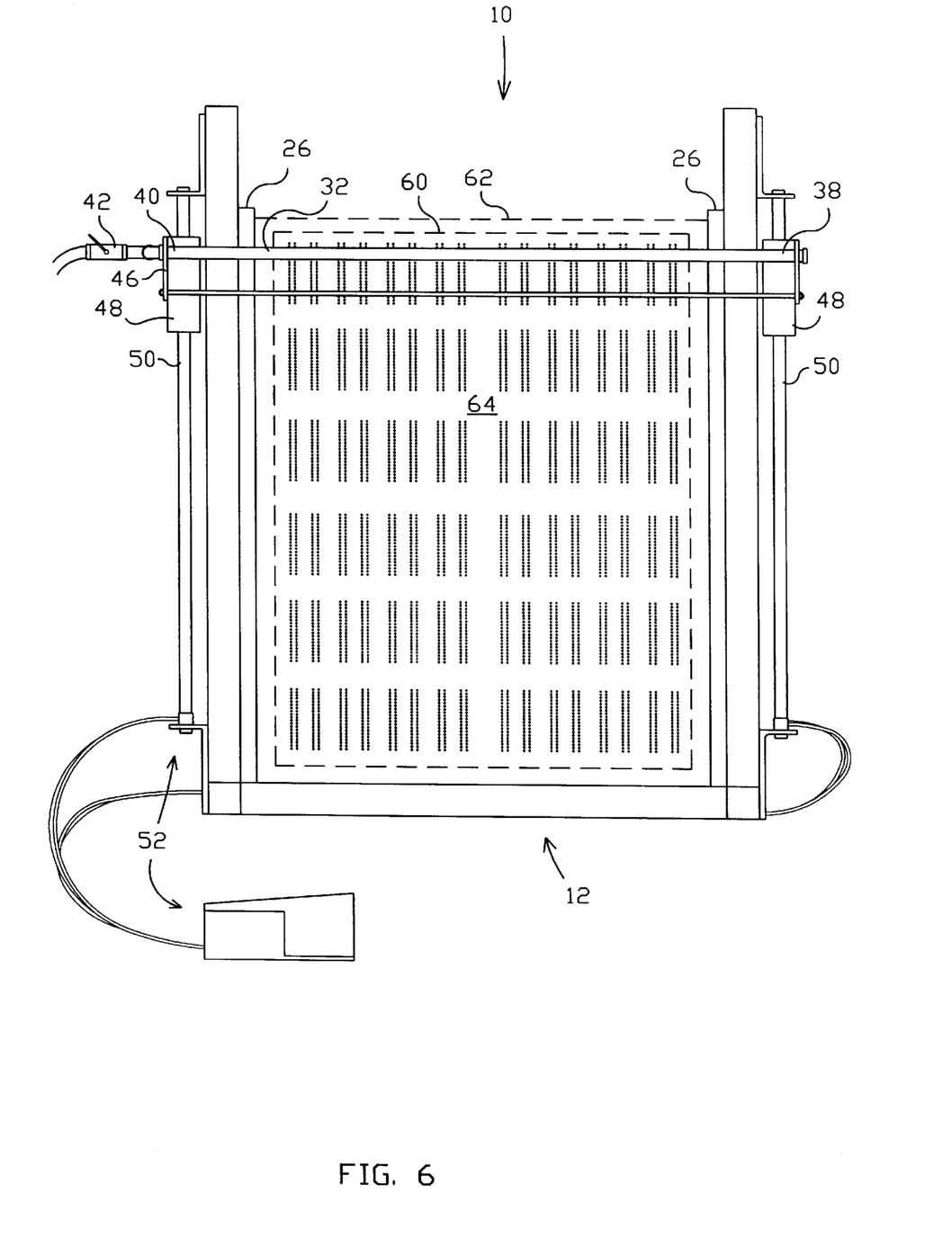
FIG. 6 is a front elevation view of the stencil dryer of FIG. 4 with a stencil positioned in the dryer and with the distribution pipes in the raised position.
Figure 7:
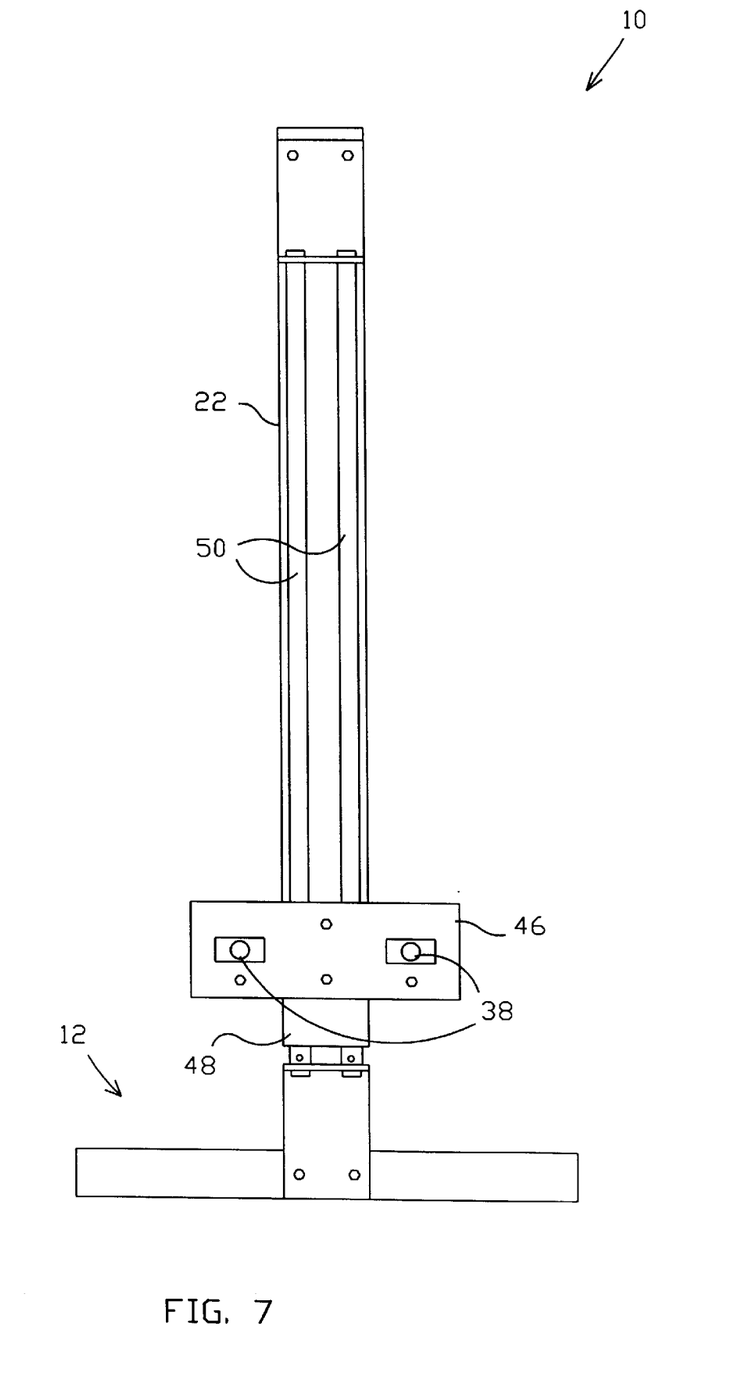
FIGS. 7 and 8 are right and left side elevation views, respectively, of the stencil dryer of FIG. 4.
Figure 8:
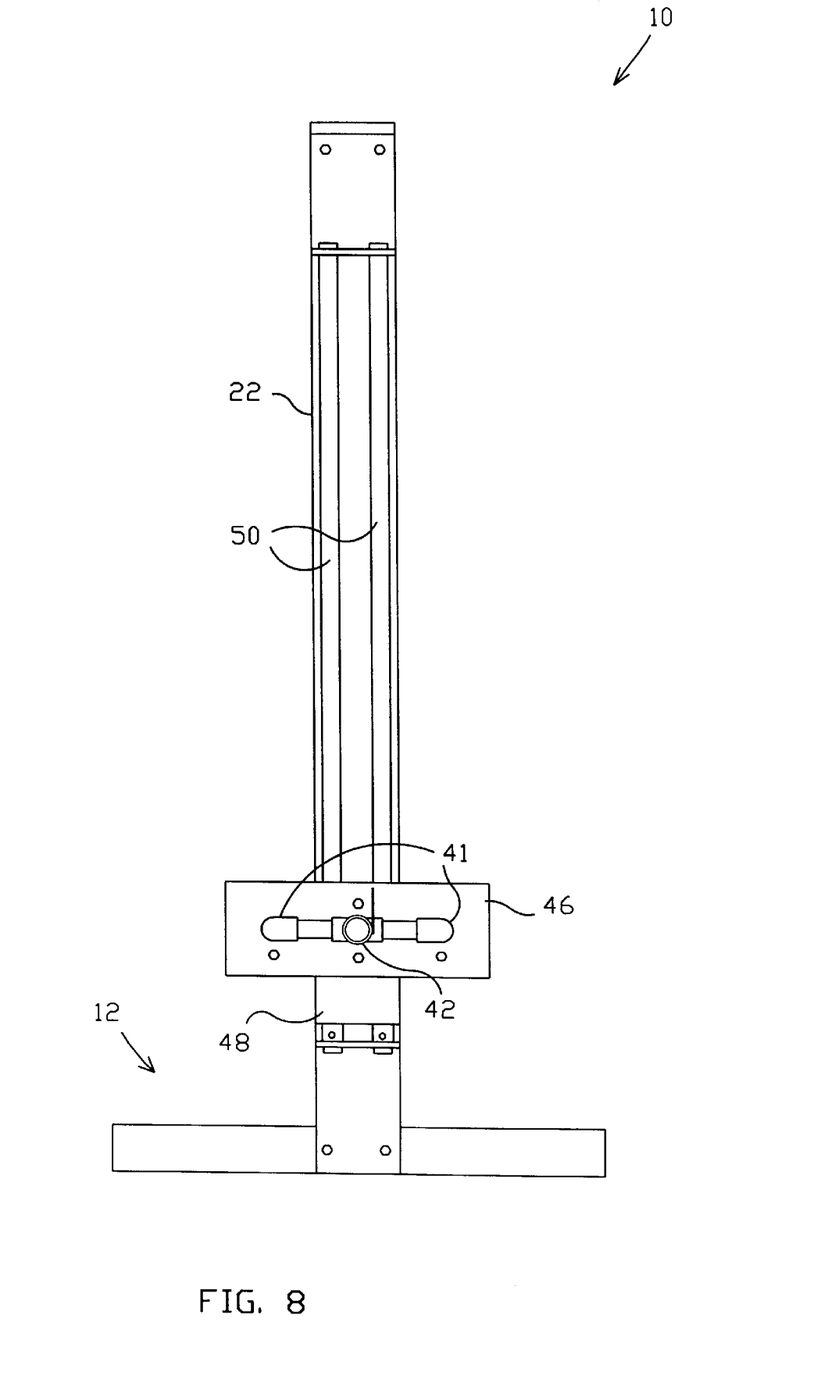
Figure 9:
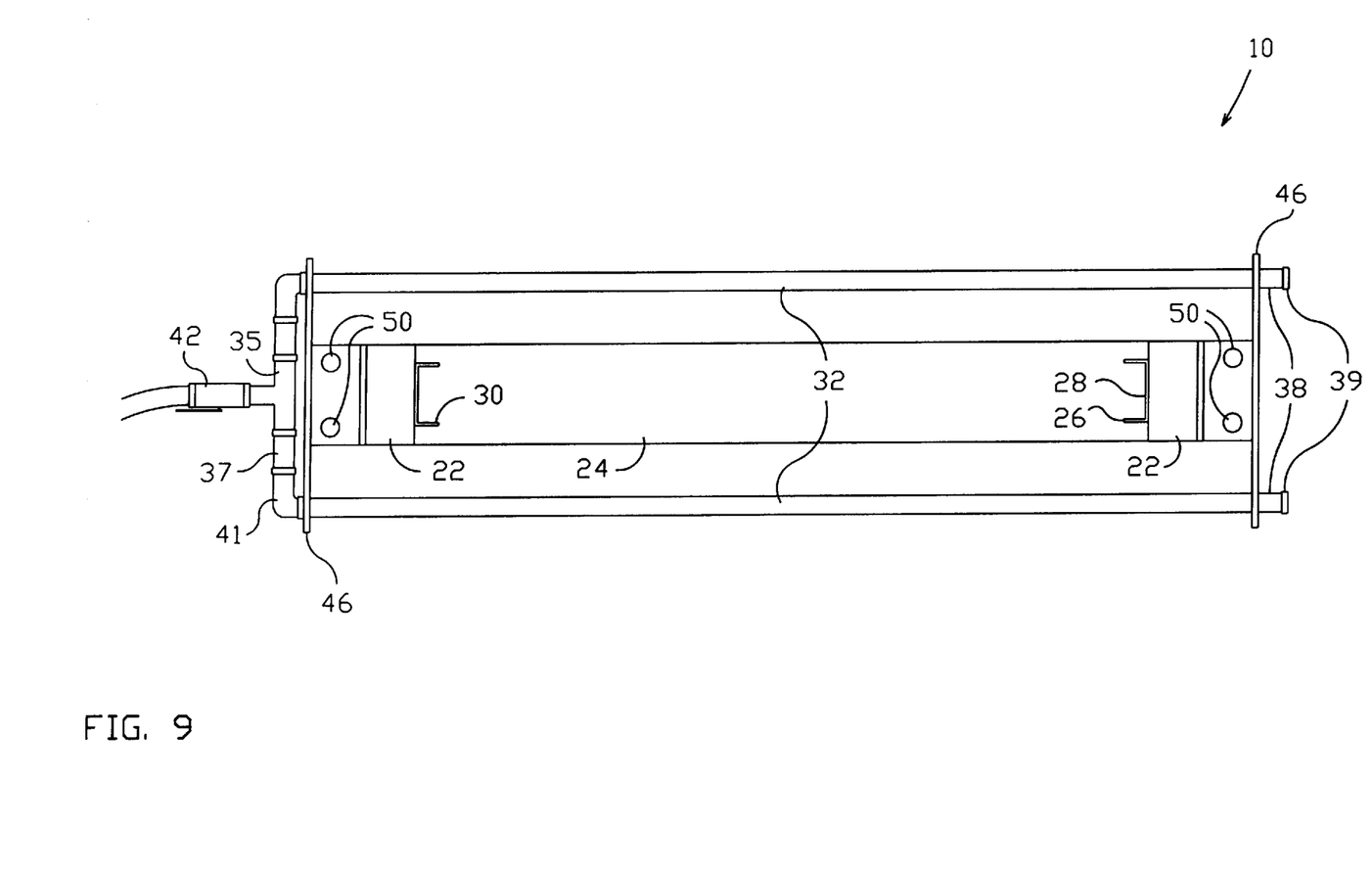
FIG. 9 is a top down plan view of the stencil dryer of FIG. 4.

Referring to FIGS. 1–3, the operative components of stencil dryer 10 are supported by frame 12. Frame 12 includes a pair of stanchions 22 and stringer 24 which extends horizontally between stanchions 22. Stanchions 22 and stringer 24 may be made of any suitable structurally stable shape and material, such as square or rectangular metal tubing. Holders 26 are mounted on stanchions 22. Holders 26 guide stencil 60 into the proper position and hold it there during cleaning operations. In this embodiment of the invention, holders 26 are flat plates attached to and extending from the sides of stanchions 22. The holders 26 thus form a channel into which the stencil 60 is loaded for drying operations. Holders 26 and stanchions 22 are sized to prevent any significant lateral movement of stencil 60 when it is in holder 26. Thus, the width of stanchions 22 is only nominally larger than the stencil frame 62 and holders 26 extend from stanchions along a substantial portion of the stencil frame 62.

A pair of air knives 31 are mounted parallel to one another on opposite sides of stanchions 22. Air knives 31 extend horizontally between stanchions 22 to reach across stencil 60 when it is positioned in holders 26. The term "air knife" as used herein means generally any air distribution mechanism that allows for the discharge of air across the surface of the stencil through a continuous opening. For example, air knives 31 may simply be a pair of pipes each having a lengthwise slit through which air is discharged against the stencil. Preferably, air knives 31 are commercially available air knives such as the EXAIR-KNIFE™ Model #2030 air knife. Openings 33 in air knives 31 are oriented inward so that air discharged through the openings is directed against stencil 60 when is it in position in holders 26. The inlet ends 40 of air knives 31 are connected to a supply of compressed air (not shown). Preferably, each opening 33 is oriented at an angle in the range of 20° to 70° below horizontal, and most preferably about 62° below horizontal. The opening 31 in an EXAIR-KNIFE Model #2030 air knife is approximately 0.002 inches. For this size opening, and using 65 p.s.i. air, air knives 31 should be positioned between 4 inches and 8 inches from the surface of the stencil. It has been observed that this configuration of the air knives 31 is sufficient to remove substantially all of the cleaning solution from the stencil during one cycle of air knives 31 passing over the stencil without damaging the stencil. As will be apparent to those skilled in the art, the parameters described above relating to size, spacing, pressure and the like may varied as necessary to achieve the desired performance characteristics of the stencil dryer.

Air knives 31 are slidably mounted on shafts 50 through sliders 48. Air knives 31 are attached to sliders 48 using bracket 56. Sliders 48 represent any conventional pillow block or similar device having a bore, preferably lined with a linear bearing or bushing, through which shafts 50 may slide. A driver mechanism 52, such as a conventional pneumatic or hydraulic cylinder, raises and lowers air knives 31. Shafts 50 are made sufficiently long and sliders 48 are sized to allow air knives 31 to travel through the full height of stencil 60.

In operation, stencil 60 is placed into holders 26. Valve 42 is opened to introduce compressed air into air knives 31. A foot pedal, or other suitable actuator, is depressed to actuate driver mechanism 52 to raise and lower air knives 31 to direct the air fully across the surface 64 of stencil 60. Residual cleaning solution on stencil 60 is removed under the evaporative effects of the air rushing over the surface of the stencil and, because openings 33 are oriented at a downward angle, the residual cleaning solution is also pushed down and off the bottom of stencil 60. Although stencil 60 is shown to be loaded into holders 26 from the top and held in a vertical orientation and, correspondingly, air knives 31 are raised and lowered during drying operations, other loading scenarios and stencil orientations are possible. For example, stencil dryer 10 could be configured so that the stencil is oriented horizontally. The air knives 31 would then be moved horizontally back and forth (rather than vertically up and down) during drying operations.

Figures 10, 11:
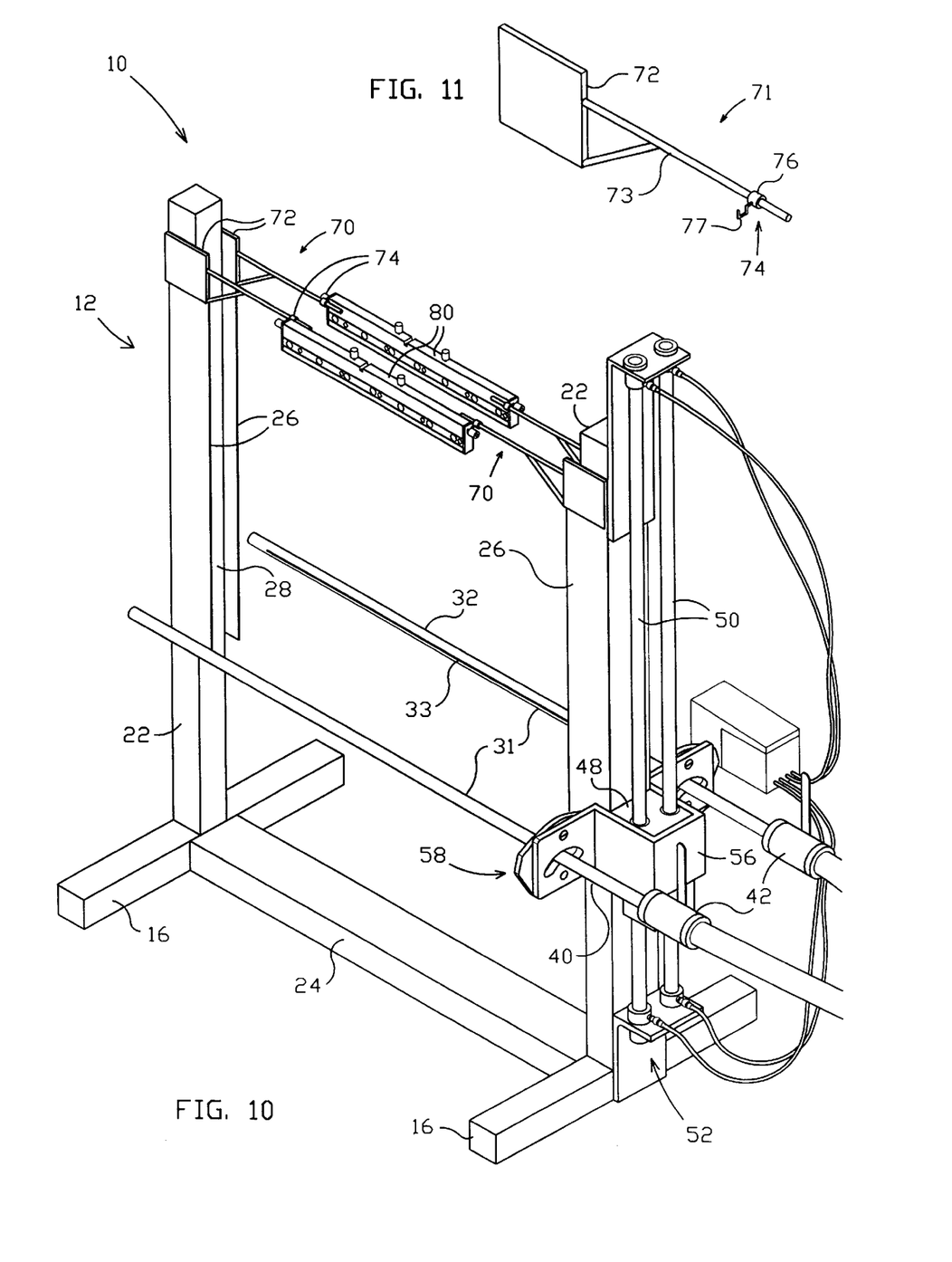
FIG. 10 is a perspective view of the stencil dryer of FIG. 1 with the optional squeegee holders installed.
FIG. 11 is a detail perspective view illustrating a squeegee holder typical of the squeegee holders in each pair of such holders shown in FIG. 10.

Referring to FIG. 10, optional squeegee holders 70 are shown installed on stencil dryer 10. Squeegee holders 70, which hold squeegees 80 in position between air knives 31, permit drying one or two squeegees using the operative features described above for drying a stencil. Referring now to FIGS. 10 and 11, each squeegee holder 70 consists of a pair of support assemblies 71. Each support assembly 71 includes a mounting plate 72, arm 73 and craddle bracket 74. Support assemblies 71 are mounted on stencil dryer 10 by attaching mounting plates 72 to holders 26. Alternatively, mounting plates 72 may be attached directly to stanchions 22. Arms 73 are attached to and extend away from mounting plates 72 toward the opposing holder 26 and, correspondingly, toward the opposing support assembly in the pair. Craddle brackets 74 are slidably attached to arms 73. Craddle brackets 74 include an attaching portion 76 and a craddle portion 77. Arms 73 are, preferably, round bar or small diameter pipe and attaching portion 76 of craddle brackets 74 is a short piece of tubing sized and shaped to slide over arm 73. Craddle brackets 74 may be attached to arms 73 using a set screw or other suitable fastener that allows craddle brackets 74 to slide along arms 73 and still support squeegee 80. In this way, the distance between opposing craddle brackets in each pair of support assemblies 71 may be adjusted to accomodate different size squeegees. Craddle portion 77 of craddle brackets 74 is a generally U-shaped member sized and shaped to receive the projections on each end of a conventional squeegee 80.

An alternative embodiment of stencil dryer 10 is illustrated in FIGS. 4–9. In this embodiment, the air knives previously described are replaced by a pair of distribution pipes that have a multiplicity of orifices through which the air is discharged against the stencil. Referring now to FIGS. 4–9, the operative components of stencil dryer 10 are supported by frame 12. Frame 12 includes a pair of stanchions 22 and a stringer 24 which extends horizontally between stanchions 22. Holders 26 are mounted on stanchions 22. Holders 26 guide stencil 60 into the proper position and hold it there during cleaning operations. Preferably, holders 26 are U-shaped metal channels that extend along substantially the full height of stencil 60. Holders 26 are sized and shaped to prevent any significant lateral movement of stencil 60 when it is in holder 26. Thus, web 28 of each holder 26 is only nominally larger than the stencil frame 62 and sides 30 of each holder extend away from web 28 along a substantial portion of the stencil frame 62.

A pair of distribution pipes 32 are mounted parallel to one another on opposite sides of holders 26. Pipes 32 extend horizontally between side support assemblies 14. A multiplicity of orifices 34 are spaced apart at predetermined intervals along the length of each pipe 32 between holders 26. Orifices 34 are oriented inward so that air discharged through the orifices 34 is directed against stencil 60 when is it in position in holders 26. The inlet ends 40 of pipes 32 are connected to a supply of compressed air (not shown) through elbow couplings 41, pipe nipples 37, T coupling 35 and valve 42. In one configuration of the distribution pipes as shown and described herein, pipes 32 have an inside diameter of 1 inch and there are seven ½ inch orifices 34 spaced 4 inches apart along each pipe 32. Other configurations are possible. Preferably, orifices 34 are positioned in distribution pipes 32 at an angle in the range of 20° to 70° below horizontal. For this size and configuration of orifices 34, and using a supply of compressed air of 90 p.s.i., pipes 32 should be positioned about 6 inches from the planar surface of the stencil. It has been observed that this configuration of orifices 34 is sufficient to remove substantially all of the cleaning solution from the stencil during one operating cycle of the dryer without damaging the stencil. Preferably, pipes 32 have a substantially circular cross section. Other cross sections may be used. For example, pipes 32 may be rectangular or elliptical provided such alternative cross sections allow for the distribution and discharge of the compressed air through orifices 34 over the surface 64 of stencil 60.

The ends 38, 40 of distribution pipes 32 extend through and are supported in slots 44 in end plates 46. For additional stability, a pair of rods 47 extend between and are fastened to end plates 46. The height of slots 44 is only nominally larger than the outside diameter of pipes 32 to prevent any significant vertical movement of pipes 32 in slots 44. The height of slots 44 is smaller than the outside diameter of end caps 39 and elbow couplings 41. End caps 39 and elbow couplings 41 thus limit the lengthwise travel of pipes 32 in slots 44. Preferably, the width of slots 44 is significantly greater than the outside diameter of slots 44 to allow for the lateral movement of pipes 32 perpendicular to the surface 64 of stencil 60. Similarly, the length of pipes 32 between end caps 39 and elbow couplings 41 is, preferably, somewhat greater than the distance between end plates 46 to allow for the lateral movement of pipes 32 parallel to the surface 64 of stencil 60. In this way, the lateral position of pipes 32 and, correspondingly, orifices 34, relative to surface 64 of stencil 60 can be adjusted as desired to optimize the drying effect of the air being discharged against surface 64 of stencil 60.

End plates 46 are slidably mounted on shafts 50 through sliders 48. End plates 46 are fastened directly to sliders 48 which are mounted on shafts 50. Sliders 48 represent any conventional pillow block or similar device having a bore, preferably lined with a linear bearing or bushing, through which shafts 50 may slide. A driver mechanism 52, such as a conventional pneumatic or hydraulic cylinder, raises and lowers distribution pipes 32. Shafts 50 are made sufficiently long and sliders 48 are sized to allow pipes 32 to travel through the full height of stencil 60.

In operation, stencil 60 is placed into holders 26. Valve 42 is opened to introduce compressed air into distribution pipes 32. A foot pedal, or other suitable actuator, is depressed to actuate driver mechanism 52 to raise and lower pipes 32 to direct the air fully across the surface 64 of stencil 60. Distribution pipes 32 may be positioned relative to stencil 60 by moving the pipes laterally in slots 44 as necessary to optimize the drying effect of the air.

There has been shown and described a new stencil dryer that automatically directs compressed air over a stencil to remove and dry residual cleaning solution. The new stencil dryer reduces the time needed to dry the stencils compared to conventional methods, and minimizes the risk of damaging stencils during drying operations. The particular embodiments shown and described herein are for purposes of example and should not be construed to limit the invention as set forth in the appended claims. It will be apparent to those skilled in the art that other forms and details may be made thereto without departing from the spirit and scope of the invention.

What is claimed is:

1. A stencil dryer, comprising:
   a. a holder means for holding the stencil;
   b. a discharge means for discharging air against a stencil positioned in the holder means; and
   c. a driver means operatively coupled to the discharge means for moving the discharge means along substantially the full extent of the stencil.

2. A stencil dryer according to claim 1, wherein the holder means comprises a pair of opposing channels sized and shaped and spaced apart to receive and hold the stencil.

3. A stencil dryer according to claim 2, further comprising a squeegee holder disposed adjacent to the channels, the squeegee holder being adapted to hold a squeegee within the extent of the stencil so that air discharged from the discharge means is directed against the squeegee when the squeegee is positioned in the squeegee holder.

4. A stencil dryer according to claim 3, wherein the squeegee holder comprises a pair of support assemblies mounted on opposing channels, each support assembly comprising:
   a. a plate mounted on one of the channels;
   b. an arm attached to and extending away from the plate toward the opposing channel and, correspondingly, toward the opposing support assembly; and
   c. a craddle bracket slidably attached to the arm, the craddle bracket having a U-shaped craddle portion for receiving and holding the squeegee.

5. A stencil dryer according to claim 1, wherein the discharge means comprises a pair of air knives disposed parallel to one another on opposite sides of the holder means so that the stencil is between the air knives when the stencil is positioned in the holder means, the air knives being oriented inward toward the stencil when the stencil is positioned in the holder means so that air discharged from the air knives is directed against the stencil.

6. A stencil dryer according to claim 1, wherein the discharge means comprises:
   a. a pair of air distribution pipes disposed parallel to one another on opposite sides of the holder means so that the stencil is between the distribution pipes when the stencil is positioned in the holder means; and
   b. a plurality of orifices disposed along each distribution pipe through which air is discharged against the stencil, the orifices being oriented inward toward the stencil when the stencil is positioned in the holder means so that air discharged from the orifices is directed against the stencil.

7. A stencil dryer, comprising:
   a. a pair of opposing channels for holding the stencil;
   b. a pair of air knives disposed parallel to one another on opposite sides of the channels so that the stencil is between the air knives when the stencil is positioned in the channels; and
   c. wherein the air knives are oriented inward toward the stencil when the stencil is positioned in the channels so that air discharged from the air knives is directed against the stencil.

8. A stencil dryer according to claim 7, wherein the channels are upstanding and sized and shaped and spaced apart to receive and hold the stencil in a substantially vertical orientation.

9. A stencil dryer according to claim 8, wherein the air knives are oriented at an angle in the range of 20° to 70° below horizontal.

10. A stencil dryer according to claim 7, wherein the air knives are slidably mounted on at least one shaft so that the air knives can be moved on the shaft to direct air against substantially the entire surface of the stencil.

11. A stencil dryer according to claim 10, further comprising a driver mechanism for moving the air knives on the shaft along substantially the full extent of the stencil.

12. A stencil dryer according to claim 11, further comprising an actuator operatively connected to the driver mechanism, the actuator being operable between an energized position which causes the driver mechanism to move the air knives and a de-energized position which prevents the driver mechanism from moving the air knives.

13. A stencil dryer according to claim 7, further comprising a valve operatively coupled between an air supply and the air knives, the valve being operative between an open position which allows air to flow into the air knives and a closed position which prevents the air from flowing into the air knives.

14. A stencil dryer, comprising:
   a. a pair of opposing channels for holding the stencil;
   b. a pair of air distribution pipes disposed parallel to one another on opposite sides of the channels so that the stencil is between the distribution pipes when the stencil is positioned in the channels; and
   c. a plurality of orifices disposed along each distribution pipe through which air is discharged against the stencil, the orifices being oriented inward toward the stencil when the stencil is positioned in the channels so that air discharged from the orifices is directed against the stencil.

15. A stencil dryer according to claim 14, wherein each distribution pipe has an inlet end connected to a supply of compressed air and a terminal end that blocks the flow of air so that the air is discharged through the orifices.

16. A stencil dryer according to claim 15, further comprising a valve operatively coupled between the air supply and inlet ends of the distribution pipes, the valve being operative between an open position which allows air to flow into the distribution pipes and a closed position which prevents the air from flowing into the distribution pipes.

17. A stencil dryer according to claim 14, wherein:
   a. the channels are upstanding and sized and shaped and spaced apart to receive and hold the stencil in a substantially vertical orientation; and
   b. the orifices are positioned in the distribution pipes at an angle in the range of 20° to 70° below horizontal.

18. A stencil dryer according to claim 14, wherein the distribution pipes are slidably mounted on at least one vertical shaft so that the distribution pipes can be moved on the shaft to discharge the air against substantially the entire surface of the stencil.

19. A stencil dryer according to claim 14, further comprising a driver mechanism for moving the distribution pipes on the shaft along substantially the full extent of the stencil.

20. A stencil dryer according to claim 19, further comprising an actuator operatively connected to the driver mechanism, the actuator being operable between an energized position which causes the driver mechanism to move the distribution pipes and a de-energized position which prevents the driver mechanism from moving the distribution pipes.

* * * * *